(12) United States Patent
Oosterlaken

(10) Patent No.: US 12,512,350 B2
(45) Date of Patent: Dec. 30, 2025

(54) APPARATUS AND METHOD TO PROCESS WAFERS

(71) Applicant: ASM IP Holding B.V., Almere (NL)

(72) Inventor: Theodorus G.M. Oosterlaken, Oudewater (NL)

(73) Assignee: ASM IP Holding B.V., Almere (NL)

( * ) Notice: Subject to any disclaimer, the term of this patent is extended or adjusted under 35 U.S.C. 154(b) by 430 days.

(21) Appl. No.: 16/983,438

(22) Filed: Aug. 3, 2020

(65) Prior Publication Data

US 2021/0050231 A1 Feb. 18, 2021

Related U.S. Application Data

(60) Provisional application No. 62/886,830, filed on Aug. 14, 2019.

(51) Int. Cl.
*H01L 21/67* (2006.01)
*H01L 21/66* (2006.01)
*H01L 21/673* (2006.01)

(52) U.S. Cl.
CPC .... *H01L 21/6735* (2013.01); *H01L 21/67253* (2013.01); *H01L 21/67288* (2013.01); *H01L 22/12* (2013.01)

(58) Field of Classification Search
None
See application file for complete search history.

(56) References Cited

U.S. PATENT DOCUMENTS

| | | |
|---|---|---|
| 3,197,682 A | 7/1965 | Klass et al. |
| 3,634,740 A | 1/1972 | Stevko |
| 3,916,270 A | 10/1975 | Wachtler et al. |
| 3,983,401 A | 9/1976 | Livesay |
| 4,099,041 A | 7/1978 | Berkman et al. |
| 4,184,188 A | 1/1980 | Briglia |
| 4,384,918 A | 5/1983 | Abe |
| 4,412,133 A | 10/1983 | Eckes et al. |
| 4,480,284 A | 10/1984 | Tojo et al. |
| 4,496,828 A | 1/1985 | Kusmierz et al. |
| 4,502,094 A | 2/1985 | Lewin et al. |
| 4,520,421 A | 5/1985 | Sakitani et al. |
| 4,551,192 A | 11/1985 | Di Milia et al. |

(Continued)

FOREIGN PATENT DOCUMENTS

| | | |
|---|---|---|
| CN | 102539019 | 9/2013 |
| CN | 203721699 | 7/2014 |

(Continued)

OTHER PUBLICATIONS

CNIPA; Office Action dated Mar. 30, 2021 in Application No. 201610131743.1.
(Continued)

*Primary Examiner* — Ronald P Jarrett
(74) *Attorney, Agent, or Firm* — Snell & Wilmer L.L.P.

(57) ABSTRACT

The disclosure relates to an apparatus for processing wafers with a process chamber to process wafers held in a wafer boat; a cassette handler chamber to handle wafer cassettes; and, a wafer handler chamber provided with a wafer handler to transfer wafers from wafer cassettes to the wafer boat. The wafer handler is constructed and arranged to transfer wafers between a wafer storage, the wafer boat and wafer cassettes.

16 Claims, 3 Drawing Sheets

(56) References Cited

U.S. PATENT DOCUMENTS

| | | | |
|---|---|---|---|
| 4,554,611 A | 11/1985 | Lewin | |
| 4,700,089 A | 10/1987 | Fujii et al. | |
| 4,886,162 A | 12/1989 | Ambrogio | |
| 4,931,135 A | 6/1990 | Horiuchi et al. | |
| 5,117,121 A | 5/1992 | Watanabe et al. | |
| 5,124,272 A | 6/1992 | Saito et al. | |
| 5,125,710 A | 6/1992 | Gianelo | |
| 5,208,961 A | 5/1993 | Lajoie | |
| 5,242,501 A | 9/1993 | McDiarmid | |
| 5,280,894 A | 1/1994 | Witcraft et al. | |
| 5,298,089 A | 3/1994 | Bowe et al. | |
| 5,310,410 A | 5/1994 | Begin et al. | |
| 5,456,757 A | 10/1995 | Aruga et al. | |
| 5,584,936 A | 12/1996 | Pickering et al. | |
| 5,645,646 A | 7/1997 | Beinglass et al. | |
| 5,661,263 A | 8/1997 | Salvaggio | |
| 5,690,742 A | 11/1997 | Ogata et al. | |
| 5,855,687 A | 1/1999 | DuBois et al. | |
| 5,871,586 A | 2/1999 | Crawley et al. | |
| 5,888,304 A | 3/1999 | Umotoy et al. | |
| 6,022,180 A | 2/2000 | Motoyama et al. | |
| 6,022,802 A | 2/2000 | Jang | |
| 6,025,117 A | 2/2000 | Nakano et al. | |
| 6,033,215 A | 3/2000 | Ohsawa | |
| 6,099,651 A | 8/2000 | Sajoto et al. | |
| 6,176,929 B1 | 1/2001 | Fukunaga et al. | |
| 6,217,662 B1 | 4/2001 | Kong et al. | |
| 6,239,715 B1 | 5/2001 | Belton | |
| 6,271,320 B1 | 8/2001 | Keller et al. | |
| 6,328,561 B1 | 12/2001 | Hasper et al. | |
| 6,474,987 B1 | 11/2002 | Huang et al. | |
| 6,475,902 B1 | 11/2002 | Hausmann et al. | |
| 6,596,398 B1 | 7/2003 | Russo et al. | |
| 6,676,759 B1 | 1/2004 | Takagi | |
| 6,696,367 B1* | 2/2004 | Aggarwal | H01L 21/67781 438/758 |
| 6,712,949 B2 | 3/2004 | Gopal | |
| 6,776,849 B2 | 8/2004 | Aggarwal et al. | |
| 6,854,580 B2 | 2/2005 | Braford | |
| 6,867,086 B1 | 3/2005 | Chen et al. | |
| 6,902,647 B2* | 6/2005 | Hasper | H01L 21/67161 156/345.31 |
| RE38,937 E | 1/2006 | Nakamura | |
| D524,600 S | 7/2006 | Austin et al. | |
| D525,127 S | 7/2006 | Cogley et al. | |
| 7,122,844 B2 | 10/2006 | Nakamura et al. | |
| D535,673 S | 1/2007 | Conway et al. | |
| D549,815 S | 8/2007 | Murphy | |
| D562,357 S | 2/2008 | Hardy | |
| 7,416,405 B2 | 8/2008 | Asari et al. | |
| 7,662,689 B2 | 2/2010 | Boyanov et al. | |
| D614,258 S | 4/2010 | Kojima | |
| 7,727,880 B1 | 6/2010 | Chattopadhyay et al. | |
| 8,253,204 B2 | 8/2012 | Lee et al. | |
| 8,292,563 B2* | 10/2012 | Haris | H01L 21/67271 414/217 |
| 8,398,773 B2 | 3/2013 | Jdira et al. | |
| 8,443,484 B2 | 5/2013 | Ozaki et al. | |
| 8,507,720 B2 | 8/2013 | Shay | |
| 8,895,395 B1 | 11/2014 | Kerber et al. | |
| 8,969,934 B1 | 3/2015 | Cheng et al. | |
| 9,214,340 B2 | 12/2015 | Kurita et al. | |
| 9,337,031 B2 | 5/2016 | Kim et al. | |
| D759,193 S | 6/2016 | Gutierrez et al. | |
| 9,428,833 B1 | 8/2016 | Duvall et al. | |
| 9,449,987 B1 | 9/2016 | Miyata et al. | |
| D784,276 S | 4/2017 | Tiner et al. | |
| 9,653,267 B2 | 5/2017 | Carducci et al. | |
| D797,067 S | 9/2017 | Zhang et al. | |
| D800,782 S | 10/2017 | Bever et al. | |
| D801,942 S | 11/2017 | Riker et al. | |
| 9,812,372 B2 | 11/2017 | Choi et al. | |
| 9,837,355 B2 | 12/2017 | Briggs et al. | |
| 9,850,573 B1 | 12/2017 | Sun | |
| D807,494 S | 1/2018 | Kim et al. | |
| 9,920,451 B2 | 3/2018 | Sivaramakrishnan et al. | |
| 9,929,055 B2 | 3/2018 | Dube et al. | |
| 9,970,112 B2 | 5/2018 | Koshi et al. | |
| D825,614 S | 8/2018 | Bever et al. | |
| 10,229,851 B2 | 3/2019 | Briggs et al. | |
| D849,055 S | 5/2019 | Kneip | |
| D864,134 S | 10/2019 | Watarai et al. | |
| 10,529,595 B2* | 1/2020 | Lee | H01L 21/67178 |
| 10,622,236 B2 | 4/2020 | Kuo et al. | |
| 10,662,525 B2 | 5/2020 | Jang et al. | |
| D913,980 S | 3/2021 | Lee et al. | |
| D914,620 S | 3/2021 | Rokkam et al. | |
| 11,018,003 B2 | 5/2021 | Huang et al. | |
| D922,229 S | 6/2021 | Jun et al. | |
| 2001/0003271 A1 | 6/2001 | Otsuki | |
| 2001/0007244 A1 | 7/2001 | Matsuse | |
| 2001/0024387 A1 | 9/2001 | Raaijmakers et al. | |
| 2002/0022347 A1 | 2/2002 | Park et al. | |
| 2002/0037645 A1 | 3/2002 | Matsunaga et al. | |
| 2003/0013314 A1 | 1/2003 | Ying et al. | |
| 2003/0049580 A1 | 3/2003 | Goodman | |
| 2003/0113995 A1 | 6/2003 | Xia et al. | |
| 2003/0150386 A1 | 8/2003 | Shimada | |
| 2003/0157345 A1 | 8/2003 | Beldi et al. | |
| 2003/0168174 A1 | 9/2003 | Foree | |
| 2003/0200926 A1 | 10/2003 | Dando et al. | |
| 2004/0005753 A1 | 1/2004 | Kostamo et al. | |
| 2004/0040659 A1 | 3/2004 | Hasper | |
| 2004/0099635 A1 | 5/2004 | Nishikawa | |
| 2004/0118342 A1 | 6/2004 | Cheng et al. | |
| 2004/0126929 A1 | 7/2004 | Tang et al. | |
| 2005/0023231 A1 | 2/2005 | Huang et al. | |
| 2005/0051854 A1 | 3/2005 | Cabral et al. | |
| 2005/0193952 A1 | 9/2005 | Goodman et al. | |
| 2006/0110930 A1 | 5/2006 | Senzaki | |
| 2006/0110944 A1* | 5/2006 | Kesteren | H01L 21/67248 118/725 |
| 2006/0118241 A1 | 6/2006 | Ohmi et al. | |
| 2006/0130751 A1 | 6/2006 | Volfovski et al. | |
| 2006/0148151 A1 | 7/2006 | Murthy et al. | |
| 2006/0162661 A1 | 7/2006 | Jung et al. | |
| 2006/0193980 A1 | 8/2006 | Hasegawa | |
| 2006/0223337 A1 | 10/2006 | Ahn et al. | |
| 2007/0128570 A1 | 6/2007 | Goto et al. | |
| 2007/0134821 A1 | 6/2007 | Thakur et al. | |
| 2007/0144442 A1 | 6/2007 | Migita | |
| 2007/0205788 A1 | 9/2007 | Natsuhara et al. | |
| 2007/0222131 A1 | 9/2007 | Fukumoto et al. | |
| 2007/0231763 A1 | 10/2007 | Asari et al. | |
| 2007/0264427 A1 | 11/2007 | Shinriki et al. | |
| 2007/0264793 A1 | 11/2007 | Oh et al. | |
| 2007/0281106 A1 | 12/2007 | Lubomirsky et al. | |
| 2008/0092821 A1 | 4/2008 | Otsuka et al. | |
| 2008/0110401 A1 | 5/2008 | Fujikawa et al. | |
| 2008/0194113 A1 | 8/2008 | Kim et al. | |
| 2008/0210162 A1 | 9/2008 | Yonebayashi | |
| 2008/0229811 A1 | 9/2008 | Zhao et al. | |
| 2008/0276864 A1 | 11/2008 | Koelmel et al. | |
| 2009/0031954 A1 | 2/2009 | Nishikido et al. | |
| 2009/0035463 A1 | 2/2009 | Dip | |
| 2009/0093100 A1 | 4/2009 | Xia et al. | |
| 2009/0297731 A1 | 12/2009 | Goundar | |
| 2010/0031884 A1 | 2/2010 | Aggarwal et al. | |
| 2010/0075488 A1 | 3/2010 | Collins et al. | |
| 2010/0116208 A1 | 5/2010 | Sangam | |
| 2010/0133255 A1 | 6/2010 | Bahng et al. | |
| 2010/0147396 A1 | 6/2010 | Yamagishi et al. | |
| 2011/0100489 A1 | 5/2011 | Orito et al. | |
| 2011/0127702 A1 | 6/2011 | Gautam et al. | |
| 2011/0171380 A1 | 7/2011 | Higashi et al. | |
| 2011/0195574 A1 | 8/2011 | Blasco et al. | |
| 2011/0256692 A1 | 10/2011 | Tam et al. | |
| 2011/0286819 A1 | 11/2011 | Shibata et al. | |
| 2011/0297088 A1 | 12/2011 | Song et al. | |
| 2011/0318142 A1 | 12/2011 | Gage et al. | |
| 2012/0003599 A1 | 1/2012 | Patalay et al. | |
| 2012/0027547 A1 | 2/2012 | Jager et al. | |
| 2012/0177845 A1 | 7/2012 | Odedra et al. | |
| 2012/0186573 A1 | 7/2012 | Jdira et al. | |

(56) References Cited

U.S. PATENT DOCUMENTS

| | | |
|---|---|---|
| 2012/0196242 A1 | 8/2012 | Volfovski et al. |
| 2012/0219735 A1 | 8/2012 | Bakker et al. |
| 2012/0222813 A1 | 9/2012 | Pal et al. |
| 2012/0270384 A1 | 10/2012 | Sanchez et al. |
| 2012/0276306 A1 | 11/2012 | Ueda |
| 2012/0320491 A1 | 12/2012 | Doh et al. |
| 2013/0017503 A1 | 1/2013 | de Ridder et al. |
| 2013/0037532 A1 | 2/2013 | Volfovski et al. |
| 2013/0062839 A1 | 3/2013 | Tschinderle et al. |
| 2013/0068391 A1 | 3/2013 | Mazzocco et al. |
| 2013/0085618 A1 | 4/2013 | Ding |
| 2013/0089988 A1 | 4/2013 | Wang et al. |
| 2013/0109172 A1 | 5/2013 | Collins et al. |
| 2013/0109192 A1 | 5/2013 | Hawkins et al. |
| 2013/0149874 A1 | 6/2013 | Hirose et al. |
| 2013/0206066 A1 | 8/2013 | Han et al. |
| 2013/0213300 A1 | 8/2013 | Sung et al. |
| 2014/0057187 A1 | 2/2014 | Suzuki et al. |
| 2014/0080314 A1 | 3/2014 | Sasajima et al. |
| 2014/0176701 A1 | 6/2014 | Okuno et al. |
| 2014/0179092 A1 | 6/2014 | Kim |
| 2014/0187022 A1 | 7/2014 | Falster et al. |
| 2014/0190581 A1 | 7/2014 | Nagase et al. |
| 2014/0242808 A1 | 8/2014 | Akiyama et al. |
| 2014/0252710 A1 | 9/2014 | Cuvalci et al. |
| 2014/0290573 A1 | 10/2014 | Okabe et al. |
| 2014/0360430 A1 | 12/2014 | Armour et al. |
| 2015/0030782 A1 | 1/2015 | Ivanov et al. |
| 2015/0155370 A1 | 6/2015 | Tsai et al. |
| 2015/0170907 A1 | 6/2015 | Haukka et al. |
| 2015/0247259 A1 | 9/2015 | Hekmatshoar-Tabari et al. |
| 2015/0267299 A1 | 9/2015 | Hawkins et al. |
| 2015/0275355 A1 | 10/2015 | Mallikarjunan et al. |
| 2015/0307989 A1 | 10/2015 | Lindfors |
| 2015/0340266 A1 | 11/2015 | Ngo et al. |
| 2016/0010208 A1 | 1/2016 | Huang et al. |
| 2016/0032453 A1 | 2/2016 | Qian et al. |
| 2016/0086811 A1 | 3/2016 | Mackedanz et al. |
| 2016/0111304 A1 | 4/2016 | Takahashi et al. |
| 2016/0133504 A1 | 5/2016 | Chu et al. |
| 2016/0169766 A1 | 6/2016 | Ishibashi et al. |
| 2016/0204005 A1 | 7/2016 | Oki et al. |
| 2016/0204436 A1 | 7/2016 | Barker et al. |
| 2016/0211166 A1 | 7/2016 | Yan et al. |
| 2016/0273128 A1 | 9/2016 | Kang |
| 2016/0279629 A1 | 9/2016 | Michishita et al. |
| 2016/0307740 A1 | 10/2016 | Kim et al. |
| 2016/0307766 A1 | 10/2016 | Jongbloed et al. |
| 2016/0329227 A1* | 11/2016 | Hashimoto ....... H01L 21/67766 |
| 2017/0062224 A1 | 3/2017 | Fu et al. |
| 2017/0167023 A1 | 6/2017 | Proia et al. |
| 2017/0178939 A1 | 6/2017 | Omori |
| 2017/0178942 A1 | 6/2017 | Sakata et al. |
| 2017/0191685 A1 | 7/2017 | Ronne et al. |
| 2017/0218515 A1 | 8/2017 | Shin et al. |
| 2017/0222008 A1 | 8/2017 | Hsu et al. |
| 2017/0253968 A1 | 9/2017 | Yahata |
| 2017/0256393 A1 | 9/2017 | Kim et al. |
| 2018/0096844 A1 | 4/2018 | Dutartre et al. |
| 2018/0265294 A1 | 9/2018 | Hayashi |
| 2019/0032998 A1 | 1/2019 | Jdira et al. |
| 2019/0115451 A1 | 4/2019 | Lee et al. |
| 2019/0148177 A1 | 5/2019 | Yin et al. |
| 2019/0176435 A1 | 6/2019 | Bellman et al. |
| 2019/0301014 A1 | 10/2019 | Pierreux et al. |
| 2019/0304821 A1 | 10/2019 | Pierreux et al. |
| 2019/0319100 A1 | 10/2019 | Chen et al. |
| 2019/0362970 A1 | 11/2019 | Wang et al. |
| 2019/0362989 A1 | 11/2019 | Reuter et al. |
| 2019/0363015 A1 | 11/2019 | Cheng et al. |
| 2019/0393304 A1 | 12/2019 | Guillorn et al. |
| 2020/0035489 A1 | 1/2020 | Huang et al. |
| 2020/0111690 A1 | 4/2020 | Oosterlaken |
| 2020/0119038 A1 | 4/2020 | Hopkins et al. |
| 2020/0135512 A1 | 4/2020 | Oosterlaken et al. |
| 2020/0185257 A1 | 6/2020 | Nishiwaki |
| 2020/0270752 A1 | 8/2020 | Pierreux et al. |
| 2020/0283894 A1 | 9/2020 | Lehn et al. |
| 2020/0312681 A1 | 10/2020 | Tanaka et al. |
| 2020/0365433 A1 | 11/2020 | de Ridder et al. |
| 2020/0365434 A1 | 11/2020 | de Ridder |
| 2020/0395199 A1 | 12/2020 | Miyama |
| 2021/0032754 A1 | 2/2021 | White et al. |
| 2021/0033977 A1 | 2/2021 | Raaijmakers et al. |
| 2021/0035824 A1 | 2/2021 | de Ridder |
| 2021/0035839 A1 | 2/2021 | de Ridder |
| 2021/0035841 A1 | 2/2021 | Fluit |
| 2021/0054500 A1 | 2/2021 | Zope et al. |
| 2021/0054504 A1 | 2/2021 | Wang et al. |
| 2021/0057214 A1 | 2/2021 | Kengoyama et al. |
| 2021/0057223 A1 | 2/2021 | Stevens et al. |
| 2021/0057275 A1 | 2/2021 | Pierreux et al. |
| 2021/0057570 A1 | 2/2021 | Lin et al. |
| 2021/0066075 A1 | 3/2021 | Zhang et al. |
| 2021/0066079 A1 | 3/2021 | Lima et al. |
| 2021/0066080 A1 | 3/2021 | Mattinen et al. |
| 2021/0066083 A1 | 3/2021 | Haukka |
| 2021/0066084 A1 | 3/2021 | Raisanen et al. |
| 2021/0071296 A1 | 3/2021 | Watarai et al. |
| 2021/0071298 A1 | 3/2021 | Maes et al. |
| 2021/0074527 A1 | 3/2021 | Lee et al. |
| 2021/0082692 A1 | 3/2021 | Kikuchi |
| 2021/0090878 A1 | 3/2021 | Kang et al. |
| 2021/0095372 A1 | 4/2021 | Minjauw et al. |
| 2021/0102289 A1 | 4/2021 | Tsuji et al. |
| 2021/0102290 A1 | 4/2021 | Acosta et al. |
| 2021/0102292 A1 | 4/2021 | Lin et al. |
| 2021/0104399 A1 | 4/2021 | Kuroda et al. |
| 2021/0111025 A1 | 4/2021 | Zyulkov et al. |
| 2021/0111053 A1 | 4/2021 | de Ridder |
| 2021/0118667 A1 | 4/2021 | Fukazawa et al. |
| 2021/0118679 A1 | 4/2021 | Lima et al. |
| 2021/0118687 A1 | 4/2021 | Wang et al. |
| 2021/0125827 A1 | 4/2021 | Khazaka et al. |
| 2021/0125832 A1 | 4/2021 | Bhatnagar |
| 2021/0134588 A1 | 5/2021 | Kohen et al. |
| 2021/0134959 A1 | 5/2021 | Lima et al. |
| 2021/0143003 A1 | 5/2021 | Fukuda et al. |
| 2021/0151315 A1 | 5/2021 | Pierreux et al. |
| 2021/0151348 A1 | 5/2021 | Utsuno et al. |
| 2021/0151352 A1 | 5/2021 | Zope et al. |
| 2021/0156024 A1 | 5/2021 | Roh et al. |
| 2021/0156030 A1 | 5/2021 | Shugrue |
| 2021/0159077 A1 | 5/2021 | Longrie et al. |
| 2021/0166910 A1 | 6/2021 | Kim et al. |
| 2021/0166924 A1 | 6/2021 | Moon et al. |
| 2021/0166925 A1 | 6/2021 | Moon et al. |
| 2021/0272821 A1 | 9/2021 | Oosterlaken |

FOREIGN PATENT DOCUMENTS

| | | |
|---|---|---|
| CN | 104342637 | 2/2017 |
| CN | 104233226 | 6/2017 |
| CN | 104630735 | 12/2017 |
| CN | 106011785 | 10/2018 |
| EP | 0634785 | 1/1995 |
| GB | 2051875 | 1/1981 |
| JP | S5979545 | 5/1984 |
| JP | S59127847 | 7/1984 |
| JP | S60110133 | 6/1985 |
| JP | H01185176 | 7/1989 |
| JP | H01313954 | 12/1989 |
| JP | H03211753 | 9/1991 |
| JP | 2002246445 A | 8/2002 |
| JP | 2003309166 A | 10/2003 |
| JP | 2004023032 A | 1/2004 |
| JP | 2015021175 | 2/2015 |
| KR | 20000000946 | 1/2000 |
| KR | 10-2010-0015073 | 2/2010 |
| KR | 10-2010-0122701 | 11/2010 |
| KR | 10-2011-0058534 | 6/2011 |
| KR | 10-2013-0129149 | 11/2013 |
| TW | 201213596 | 4/2012 |

(56) References Cited

FOREIGN PATENT DOCUMENTS

| | | |
|---|---|---|
| TW | 201234453 | 8/2012 |
| WO | 2013177269 | 11/2013 |
| WO | 2019142055 | 7/2019 |

OTHER PUBLICATIONS

CNIPA; Office Action dated Mar. 1, 2021 in Application No. 201710131319.1.
CNIPA; Notice of Allowance dated Mar. 30, 2021 in Application No. 201710762817.6.
CNIPA; Office Action dated Jan. 28, 2021 in Application No. 201711057557.9.
CNIPA; Office Action dated Jan. 26, 2021 in Application No. 201711057929.8.
CNIPA; Office Action dated Apr. 19, 2021 in Application No. 201711328250.8.
CNIPA; Notice of Allowance dated Apr. 7, 2021 in Application No. 201780044761.9.
CNIPA; Office Action dated Jan. 29, 2021 in Application No. 201780076230.8.
CNIPA; Office Action dated Jan. 27, 2021 in Application No. 201780076321.1.
CNIPA; Office Action dated Mar. 24, 2021 in Application No. 201880048547.5.
CNIPA; Office Action dated Dec. 22, 2020 in Application No. 201910378791.4.
CNIPA; Notice of Allowance dated Apr. 7, 2021 in Application No. 202030579755.8.
EPO; Extended European Search Report dated Apr. 6, 2021 in Application No. 21150514.4.
JPO; Notice of Allowance dated Apr. 6, 2021 in Application No. 2017-139817.
JPO; Office Action dated Mar. 31, 2021 in Application No. 2018-024655.
JPO; Notice of Allowance dated Mar. 17, 2021 in Application No. 2020-010953.
KIPO; Office Action dated Mar. 23, 2021 in Application No. 10-2014-0011765.
KIPO; Office Action dated Apr. 27, 2021 in Application No. 10-2014-0027217.
KIPO; Notice of Allowance dated Apr. 15, 2021 in Application No. 10-2014-0103853.
KIPO; Notice of Allowance dated Mar. 25, 2021 in Application No. 10-2014-0128626.
KIPO; Office Action dated Apr. 20, 2021 in Application No. 10-2014-0136089.
KIPO; Office Action dated Mar. 19, 2021 in Application No. 10-2014-0156196.
KIPO; Office Action dated Mar. 29, 2021 in Application No. 10-2014-0165685.
KIPO; Office Action dated Apr. 5, 2021 in Application No. 10-2015-0031720.
KIPO; Office Action dated Apr. 19, 2021 in Application No. 10-2015-0035094.
KIPO; Office Action dated Mar. 8, 2021 in Application No. 10-2017-0054647.
KIPO; Office Action dated Mar. 10, 2021 in Application No. 10-2017-0055703.
KIPO; Notice of Allowance dated May 24, 2021 in Application No. 10-2020-0101096.
KIPO; Notice of Allowance dated Apr. 1, 2021 in Application No. 30-2020-0030139 (M001).
KIPO; Notice of Allowance dated Apr. 1, 2021 in Application No. 30-2020-0030139 (M002).
TIPO; Notice of Allowance dated May 13, 2021 in Application No. 105122394.
TIPO; Notice of Allowance dated Mar. 5, 2021 in Application No. 105131284.
TIPO; Office Action dated Feb. 25, 2021 in Application No. 105134275.
TIPO; Notice of Allowance dated Mar. 4, 2021 in Application No. 106100823.
TIPO; Notice of Allowance dated May 6, 2021 in Application No. 106108522.
TIPO; Notice of Allowance dated Mar. 4, 2021 in Application No. 106111693.
TIPO; Office Action dated Feb. 25, 2021 in Application No. 106121797.
TIPO; Office Action dated Apr. 26, 2021 in Application No. 106122231.
TIPO; Office Action dated Apr. 22, 2021 in Application No. 106124126.
TIPO; Office Action dated Apr. 22, 2021 in Application No. 106124128.
TIPO; Notice of Allowance dated Mar. 25, 2021 in Application No. 106124130.
TIPO; Office Action dated Mar. 4, 2021 in Application No. 106127948.
TIPO; Office Action dated Mar. 15, 2021 in Application No. 106129971.
TIPO; Office Action dated Apr. 7, 2021 in Application No. 106135925.
TIPO; Office Action dated Apr. 7, 2021 in Application No. 106136905.
TIPO; Office Action dated Mar. 29, 2021 in Application No. 106143559.
TIPO; Office Action dated Mar. 31, 2021 in Application No. 106143570.
TIPO; Office Action dated Jan. 15, 2021 in Application No. 108142842.
TIPO; Office Action dated Jan. 25, 21 in Application No. 108143562.
TIPO; Notice of Allowance dated May 18, 2021 in Application No. 109300595.
TIPO; Notice of Allowance dated Mar. 30, 2021 in Application No. 109305460.
USPTO; Notice of Allowance dated Feb. 10, 2021 in U.S. Appl. No. 14/219,839.
USPTO; Advisory Action dated Apr. 13, 2021 in U.S. Appl. No. 14/829,565.
USPTO; Non-Final Office Action dated May 12, 2021 in U.S. Appl. No. 14/829,565.
USPTO; Final Office Action dated Feb. 24, 2021 in U.S. Appl. No. 15/262,990.
USPTO; Advisory Action dated Apr. 28, 2021 in U.S. Appl. No. 15/262,990.
USPTO; Final Office Action dated Mar. 25, 2021 in U.S. Appl. No. 15/286,503.
USPTO; Advisory Action dated Apr. 30, 2021 in U.S. Appl. No. 15/377,439.
USPTO; Final Office Action dated Jan. 7, 2021 in U.S. Appl. No. 15/380,909.
USPTO; Non-Final Office Action dated Feb. 9, 2021 in U.S. Appl. No. 15/402,993.
USPTO; Final Office Action dated May 21, 2021 in U.S. Appl. No. 15/402,993.
USPTO; Final Office Action dated Jun. 2, 2021 in U.S. Appl. No. 15/611,707.
USPTO; Advisory Action dated Mar. 25, 2021 in U.S. Appl. No. 15/636,307.
USPTO; Non-Final Office Action dated Apr. 21, 2021 in U.S. Appl. No. 15/636,307.
USPTO; Final Office Action dated Mar. 10, 2021 in U.S. Appl. No. 15/690,017.
USPTO; Notice of Allowance dated Apr. 16, 2021 in U.S. Appl. No. 15/691,241.
USPTO; Non-Final Office Action dated Mar. 18, 2021 in U.S. Appl. No. 15/835,328.
USPTO; Notice of Allowance dated Mar. 19, 2021 in U.S. Appl. No. 15/890,037.
USPTO; Final Office Action dated Apr. 19, 2021 in U.S. Appl. No. 15/909,705.
USPTO; Non-Final Office Action dated May 20, 2021 in U.S. Appl. No. 15/917,224.
USPTO; Non-Final Office Action dated Feb. 18, 2021 in U.S. Appl. No. 15/923,834.

(56) References Cited

OTHER PUBLICATIONS

USPTO; Advisory Action dated Apr. 28, 2021 in U.S. Appl. No. 15/940,729.
USPTO; Notice of Allowance dated Apr. 7, 2021 in U.S. Appl. No. 15/940,759.
USPTO; Advisory Action dated Feb. 22, 2021 in U.S. Appl. No. 15/962,980.
USPTO; Final Office Action dated Apr. 13, 2021 in U.S. Appl. No. 15/967,146.
USPTO; Advisory Action dated Jun. 2, 2021 in U.S. Appl. No. 15/967,146.
USPTO; Non-Final Office Action dated Feb. 19, 2021 in U.S. Appl. No. 15/974,948.
USPTO; Non-Final Office Action dated May 25, 2021 in U.S. Appl. No. 15/985,539.
USPTO; Non-Final Office Action dated Apr. 5, 2021 in U.S. Appl. No. 15/996,286.
USPTO; Non-Final Office Action dated Feb. 4, 2021 in U.S. Appl. No. 16/000,109.
USPTO; Non-Final Office Action dated May 19, 2021 in U.S. Appl. No. 16/000,125.
USPTO; Notice of Allowance dated Feb. 5, 2021 in U.S. Appl. No. 16/000,156.
USPTO; Non-Final Office Action dated Mar. 19, 2021 in U.S. Appl. No. 16/004,041.
USPTO; Final Office Action dated Mar. 23, 2021 in U.S. Appl. No. 16/039,817.
USPTO; Advisory Action dated May 28, 2021 in U.S. Appl. No. 16/039,817.
USPTO; Final Office Action dated Mar. 8, 2021 in U.S. Appl. No. 16/042,791.
USPTO; Advisory Action dated May 14, 2021 in U.S. Appl. No. 16/042,791.
USPTO; Notice of Allowance dated Mar. 10, 2021 in U.S. Appl. No. 16/055,532.
USPTO; Final Office Action dated Mar. 23, 2021 in U.S. Appl. No. 16/105,745.
USPTO; Final Office Action dated Mar. 24, 2021 in U.S. Appl. No. 16/105,761.
USPTO; Advisory Action dated May 20, 2021 in U.S. Appl. No. 16/105,761.
USPTO; Final Office Action dated Mar. 18, 2021 in U.S. Appl. No. 16/105,802.
USPTO; Advisory Action dated May 27, 2021 in U.S. Appl. No. 16/105,802.
USPTO; Advisory Action dated Feb. 17, 2021 in U.S. Appl. No. 16/108,950.
USPTO; Non-Final Office Action dated Apr. 13, 2021 in U.S. Appl. No. 16/108,950.
USPTO; Notice of Allowance dated Mar. 23, 2021 in U.S. Appl. No. 16/116,708.
USPTO; Advisory Action dated Mar. 10, 2021 in U.S. Appl. No. 16/117,530.
USPTO; Non-Final Office Action dated Mar. 23, 2021 in U.S. Appl. No. 16/151,074.
USPTO; Final Office Action dated May 6, 2021 in U.S. Appl. No. 16/152,260.
USPTO; Notice of Allowance dated Feb. 24, 2021 in U.S. Appl. No. 16/167,164.
USPTO; Non-Final Office Action dated Feb. 19, 2021 in U.S. Appl. No. 16/172,535.
USPTO; Final Office Action dated May 27, 2021 in U.S. Appl. No. 16/172,535.
USPTO; Advisory Action dated Apr. 5, 2021 in U.S. Appl. No. 16/176,517.
USPTO; Notice of Allowance dated May 13, 2021 in U.S. Appl. No. 16/176,517.
USPTO; Notice of Allowance dated Feb. 19, 2021 in U.S. Appl. No. 16/183,258.
USPTO; Notice of Allowance dated Feb. 10, 2021 in U.S. Appl. No. 16/205,899.
USPTO; Non-Final Office Action dated Mar. 29, 2021 in U.S. Appl. No. 16/206,589.
USPTO; Advisory Action dated Feb. 25, 2021 in U.S. Appl. No. 16/210,922.
USPTO; Final Office Action dated Mar. 29, 2021 in U.S. Appl. No. 16/219,555.
USPTO; Non-Final Office Action dated May 2, 2021 in U.S. Appl. No. 16/240,392.
USPTO; Advisory Action dated Jan. 26, 2021 in U.S. Appl. No. 16/251,534.
USPTO; Non-Final Office Action dated Feb. 23, 2021 in U.S. Appl. No. 16/251,534.
USPTO; Non-Final Office Action dated Mar. 30, 2021 in U.S. Appl. No. 16/252,567.
USPTO; Non-Final Office Action dated Mar. 4, 2021 in U.S. Appl. No. 16/252,569.
USPTO; Non-Final Office Action dated Apr. 20, 2021 in U.S. Appl. No. 16/397,045.
USPTO; Notice of Allowance dated Mar. 10, 2021 in U.S. Appl. No. 16/400,814.
USPTO; Non-Final Office Action dated May 7, 2021 in U.S. Appl. No. 16/423,824.
USPTO; Notice of Allowance dated Apr. 28, 2021 in U.S. Appl. No. 16/453,249.
USPTO; Final Office Action dated May 20, 2021 in U.S. Appl. No. 16/468,258.
USPTO; Notice of Allowance dated Apr. 26, 2021 in U.S. Appl. No. 16/517,122.
USPTO; Final Office Action dated May 12, 2021 in U.S. Appl. No. 16/546,543.
USPTO; Non-Final Office Action dated Feb. 1, 2021 in U.S. Appl. No. 16/563,473.
USPTO; Non-Final Office Action dated May 10, 2021 in U.S. Appl. No. 16/601,593.
USPTO; Non-Final Office Action dated Feb. 24, 2021 in U.S. Appl. No. 16/637,134.
USPTO; Notice of Allowance dated Jun. 2, 2021 in U.S. Appl. No. 16/637,134.
USPTO; Notice of Allowance dated Apr. 30, 2021 in U.S. Appl. No. 16/685,787.
USPTO; Non-Final Office Action dated Apr. 5, 2021 in U.S. Appl. No. 16/704,835.
USPTO; Final Office Action dated Feb. 22, 2021 in U.S. Appl. No. 16/713,311.
USPTO; Notice of Allowance dated May 20, 2021 in U.S. Appl. No. 16/752,514.
USPTO; Notice of Allowance dated May 24, 2021 in U.S. Appl. No. 16/765,125.
USPTO; Non-Final Office Action dated Apr. 15, 2021 in U.S. Appl. No. 16/789,138.
USPTO; Notice of Allowance dated May 12, 2021 in U.S. Appl. No. 16/800,114.
USPTO; Non-Final Office Action dated Apr. 5, 2021 in U.S. Appl. No. 16/816,078.
USPTO; Non-Final Office Action dated May 19, 2021 in U.S. Appl. No. 16/828,753.
USPTO; Non-Final Office Action dated May 4, 2021 in U.S. Appl. No. 16/872,045.
USPTO; Non-Final Office Action dated May 3, 2021 in U.S. Appl. No. 16/878,443.
USPTO; Non-Final Office Action dated Dec. 31, 2020 in U.S. Appl. No. 16/924,595.
USPTO; Non-Final Office Action dated May 25, 2021 in U.S. Appl. No. 16/935,280.
USPTO; Non-Final Office Action dated Apr. 14, 2021 in U.S. Appl. No. 17/009,093.
USPTO; Ex Parte Quayle Action dated Apr. 13, 2021 in U.S. Appl. No. 29/679,620.
USPTO; Notice of Allowance dated May 19, 2021 in U.S. Appl. No. 29/702,881.

(56) References Cited

OTHER PUBLICATIONS

Aubin et al. "Very low temperature (450° C.) selective epitaxial growth of heavily in situ boron-doped SiGe layers" Semiconductor Science and Technology, 30, 10 pages (2015).

Barnscheidt et al. "Highly boron-doped germanium layers on Si(001) grown by carbon-mediated epitaxy" Semiconductor Science and Technology, 33, 9 pages (2018).

Belyansky et al. "Low Temperature Borophosphosilicate Glass (BPSG) Process for High Aspect Ratio Gap Fill" www.electrochem.org/dl/ma/201/pdfs/0705.pdf, downloaded May 15, 2021, 1 page.

Cheremisin et al. "UV-laser modification and selective ion-beam etching of amorphous vanadium pentoxide thin films" Phys. Status Solidi A, Applications and materials science, 206 (7), pp. 1484-1487 (2009).

Dingemans et al. "Plasma-Assisted ALD for the Conformal Deposition of SiO2: Process, Material and Electronic Properties" J of the Electrochemical Society, 159(3), H277-H285 (2012).

G02-1152 "Atomic Layer Deposition of Al2O3 with Alcohol Oxidants for Impeding Substrate Oxidation" Abstract. Oct. 16, 2019 (2019).

Imamura et al. "Cyclic C4F8 and O2 plasma etching of TiO2 for high-aspect-ratio three-dimensional devices" Template for JJAP Regular Papers, Jan. 2014, pp. 29 (2014).

Kim et al. "A process for topographically selective deposition on 3D nanostructures by ion implantation" ACS Nano, 10, 4, 4451-4458 (2016).

Lee et al. "Ultraviolet light enhancement of Ta2O5 dry etch rates" J. of Vacuum Science & Technology B: Microelectronics and Nanometer Structures Processing, Measurement, and Phenomena, 18, pp. 293-295 (2000).

Musschoot et al. "Atomic layer deposition of titanium nitride from TDMAT precursor" Microelectronic Engineering, 86, pp. 72-77 (2009).

Noircler et al. "Transmission electron microscopy characterization of low temperature boron doped silicon epitaxial films" CrystEngComm, 22(33), pp. 5464-5472 (2020).

Oyama et al. "Topotactic synthesis of vanadium nitride solid foams" Journal of Materials Research vol. 8. No.6, pp. 1450-1454 (1993).

Rimoldi et al. "Atomic Layer Deposition of Rhenium-Aluminum Oxide Thin Films and ReOx Incorporation in a Metal-Organic Framework" Applied Materials & Interfaces, 9, pp. 35067-35074 (2017).

Standard Motor Products LX249 Ignition Pick Up, Nov. 11, 2005, Amazon.com, May 10, 2021. URL: https://www.amazon.com/Standard-Motor-Products-LX249-Ignition/dp/B000C7ZTS4/ (2005).

Tao et al. "Improved performance of GeON as charge storage layer in flash memory by optimal annealing" Microelectronics Reliability, vol. 52, pp. 2597-2601 (2012).

Wirths et al. "Low temperature RPCVD epitaxial growth of SilxGex using Si2H6 and Ge2H6" Solid-State Electronics, 88, pp. 2-9 (2013).

Yanguas-Gil et al. "Modulation of the Growth Per Cycle in Atomic Layer Deposition Using Reversible Surface Functionalization" Chemistry of Materials, 25, pp. 4849-4860 (2013).

* cited by examiner

APPARATUS AND METHOD TO PROCESS WAFERS

CROSS-REFERENCE TO RELATED APPLICATIONS

This application is a nonprovisional and claims priority to U.S. Provisional Patent Application Ser. No. 62/886,830 filed Aug. 14, 2019 titled APPARATUS AND METHOD TO PROCESS WAFERS, the disclosure of which is hereby incorporated by reference in its entirety.

FIELD

The disclosure relates to an apparatus to process wafers. The apparatus comprising:
a process chamber to process a boat filled with wafers;
a cassette handler to handle wafer cassettes; and,
a wafer handler chamber provided with a wafer handler to transfer wafers from the wafer cassettes for processing in the process chamber. The invention also relates to a method to process wafers.

BACKGROUND

An apparatus to process wafers may comprise a cassette handler chamber to handle wafer cassettes. The cassette handler chamber may accommodate cassettes for the storing of wafers. Said cassettes may be the standardized FOUP (Front Opening Unified Pod) wafer storage cassettes for wafers with a diameter of 300 mm or other type of standardized cassettes for wafers with a diameter of 200 mm, which may have 25 slots for accommodating 25 wafers.

The cassette handler chamber may be provided with a wafer cassette handler which may transfer cassettes between an input/output station, a wafer transfer station and/or a cassette storage. The apparatus may also comprise a wafer handler, by means of which wafers can be taken out of a cassette placed at the wafer transfer station and can be placed in a wafer boat for the treatment within the process chamber of the apparatus.

During treatment of wafers within a processing chamber of a batch furnace, it may be beneficial for the process to have empty spaces in the wafer boat filled. Filler wafers can be used to fill the empty spaces between the production wafers. Filler wafers may be used as side fillers when placed on top and/or bottom of the wafer stack in the wafer boat to improve the reaction properties for the production wafers placed in between the side fillers. In general filler wafers can be reused and may stay in the apparatus until they need to be cleaned.

Test wafers which may be used to test the process in the process chamber may also be used. Test wafers may be located between the production wafers or the filler wafers in the wafer boat and may run one time through the process chamber before they may be stored or used for testing.

When using filler and/or test wafers in the apparatus, storing the filler and/or test wafers in cassettes in the cassette handler chamber reduces the storing capacity for production wafers. For processes where a high number of filler and/or test wafers is required this may lead to a cassette storage problem. The obvious solution for this problem is to increase the number of cassette receiving sites in the cassette handler chamber. However, such a solution requires extra space in the apparatus which may be not available and/or may be costly.

Transferring the filler and/or test wafers during each load from cassettes in the cassette handler chamber to the wafer handler chamber may also be time consuming. The wafer cassette for filler and/or test wafers may need to be specially transferred to and opened by the door opener while maybe only a few filler and/or test wafers may be necessary from the cassette which may cost a lot of time. During the transfer and the door opening the door opener may not be used for production wafers lowering the throughput of the apparatus.

SUMMARY

It may be desirable to provide an improved method and apparatus to supply filler and/or test wafers.

Accordingly, there may be provided an apparatus to process wafers. The apparatus may comprise a process chamber to process a boat filled with wafers; a cassette handler chamber to handle wafer cassettes; and, a wafer handler chamber provided with a wafer handler to transfer wafers from the wafer cassettes to the wafer boat for processing in the process chamber. The wafer handler chamber may be provided with a wafer storage and the wafer handler may be constructed and arranged to transfer wafers between the wafer storage, the wafer boat and/or wafer cassettes.

By having the wafer storage accessible by the wafer handler the supply of filler and/or test wafers may be improved.

Accordingly there may be provided a method for processing wafers. The method may comprise:
loading production wafers from a wafer cassette to a wafer boat with a wafer handler;
loading filler and/or test wafers from a wafer storage to the wafer boat with the wafer handler;
moving the wafer boat into the process chamber;
processing the production, the filler and/or test wafers in the wafer boat in the process chamber;
moving the wafer boat out of the process chamber; and,
unloading the production wafers from the wafer boat to the wafer cassette with the wafer handler.

These and other embodiments will become readily apparent to those skilled in the art from the following detailed description of certain embodiments having reference to the attached figures, the invention not being limited to any particular embodiment(s) disclosed.

BRIEF DESCRIPTION OF THE FIGURES

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

The figures are not drawn to scale, and particularly the dimensions and the thickness direction are exaggerated for clarity. Corresponding areas bear the same reference numerals whenever possible.

DETAILED DESCRIPTION

Figure 1:
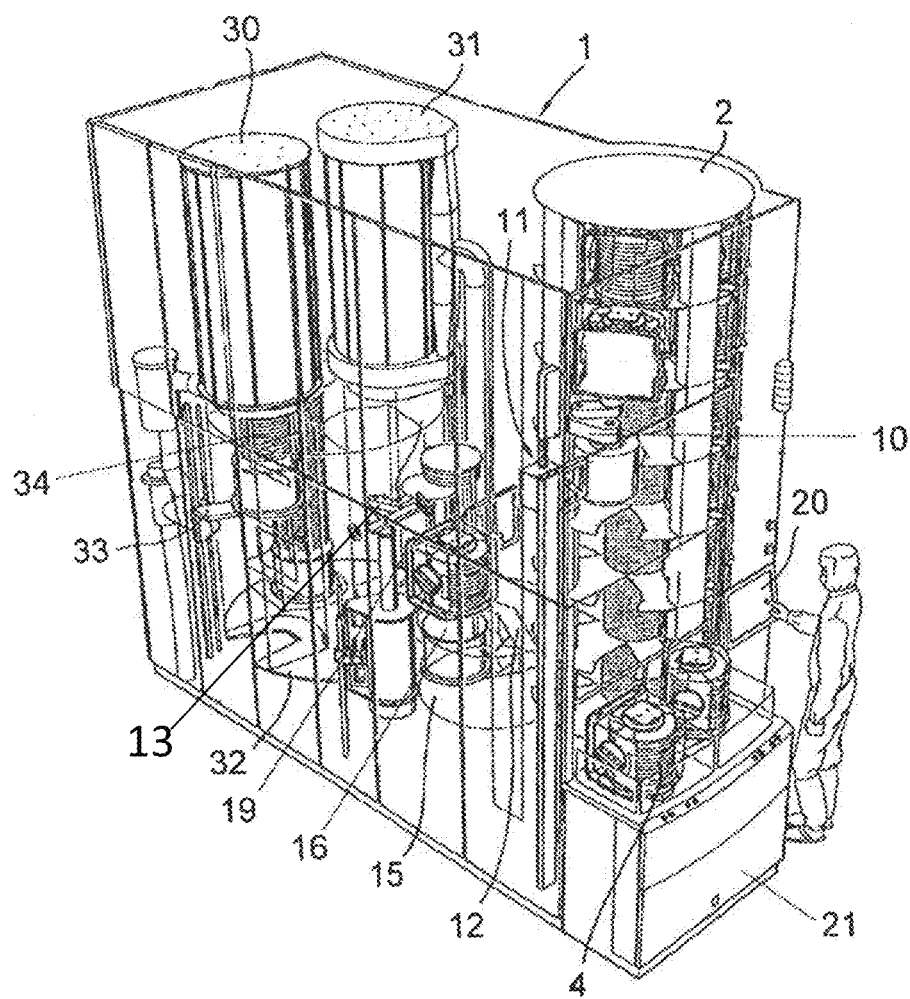
FIG. 1 is a perspective view of a first exemplary embodiment of the apparatus of the disclosure.

FIG. 1 is a perspective view of an exemplary embodiment of an apparatus of the disclosure to process wafers. The apparatus 1 is provided with two process chambers 30, 31, which can be loaded from a bottom side with a wafer boat 34, into which a number of wafers may be fed. The wafer boats 34 are arranged on a boat carousel 32, by means of which the boats 34 can be brought from an unloading and/or loading position 35, which is clearly visible in FIG. 2, to a treatment position below the first process chamber 30 or the second process chamber 31. Under both process chambers 30, 31, a lift 33 is provided, by means of which a wafer boat with wafers may be lifted so as to bring this wafer boat into a process chamber 30, 31. Furthermore, opposite the unloading and/or loading position 35 a cooling position 36 may be available where a wafer boat with wafers 34 situated on the carousel 32 can cool down after treatment in the process chamber 30, 31.

The process chamber 30, 31, and the boat carousel 32 with the boat lifts 33 are located in a rear chamber 39 in the apparatus. A wall 38, 43, may create a wafer handling chamber 44 in the apparatus. Arranged in this wafer handler chamber 44 may be a wafer handler 13, by means of which wafers can be placed in the wafer boat 34. The wafer boat 34 may be brought to the loading and/or unloading position 35 by means of a boat handling apparatus 12 via a door in the wall 38 and can be removed therefrom and placed in a wafer loading and/or unloading position 46.

A part of the wall 43 contains a number of door openings bounded by a so-called door opener 18, 19. In the present exemplary embodiment, door openers 18, 19, are available at two levels. With such a door opener 18, 19, a door of a wafer cassette, in the present art also called FOUP, can be opened and closed. For an accurate description reference is made to WO 99/38199, the contents of which are incorporated herein by reference.

A cassette handler chamber may be located on the side of the door openers 18, 19, facing away from the wafer handler chamber 44. A cassette handler 10 and a wafer cassette storage system 2, into which a large number of wafer cassettes 4 may be fed. Also available in the cassette handler chamber 45 are two turn tables 15, 16, on which a wafer cassette 4 can be placed by the wafer cassette handler 10. The wafer cassette 4 may be brought to a wafer transfer station before the door opener 18, 19, by the turn tables 15, 16. The wafer cassette 4 may be pressed against the door opener 18, 19. The door opener 18, 19, may open the wafer cassette at the wafer transfer station and the wafer handler 13 may transfer wafers through the door opening between the wafer boat 34 and the wafer cassette.

The wafer cassette handler 10 may also be positioned such that it can take a wafer cassette 4 from an input/output station 21 so as to place this either in the storage system 2 or on the turn table 15 or 16. The input/output station 21 may be used to transfer cassettes 4 between the apparatus and other wafer processing apparatus in a semiconductor plant where the apparatus is placed. Furthermore, an operating panel 20 is visible, by means of which an operator may operate the apparatus.

Figure 2:
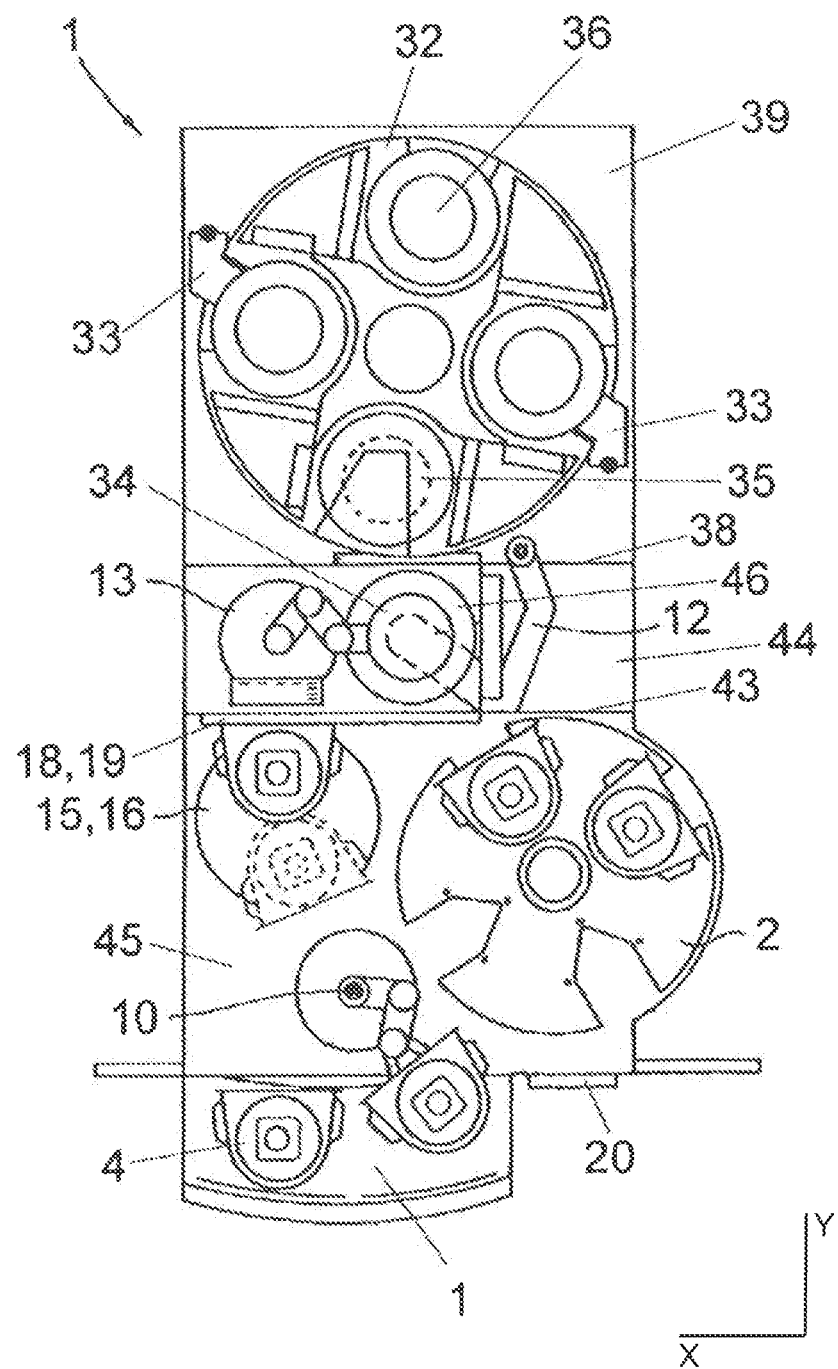
FIG. 2 is a top view of the first exemplary embodiment shown in FIG. 1.
Figure 3:
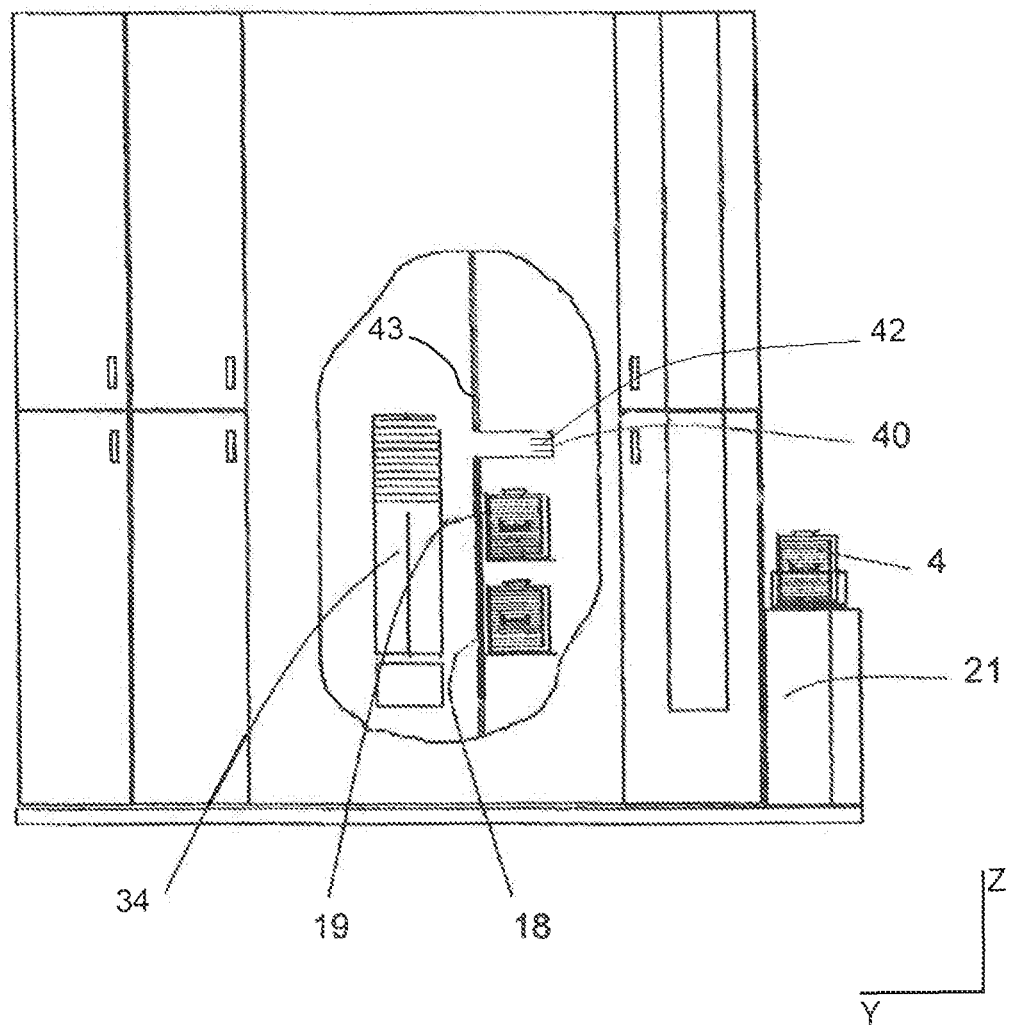
FIG. 3 is a partly opened side view of the first exemplary embodiment shown in FIGS. 1 and 2 in which a wafer storage is provided.

FIG. 3 shows a partly opened side view of the first exemplary embodiment shown in FIGS. 1 and 2 in which a wafer storage wafer 40 is provided for storing filler and/or test wafers. The wafer storage 40 may be provided in the wafer handler chamber 44 of FIG. 2.

The wafer handler chamber 44 may be provided with a wall 38, 43. The wafer storage 40 may be a wafer storage box provided with a box opening in the wall 43 in the direction of the wafer handler 13. For example, the wafer storage box may be located in the part of the wall 43 above the door openers 18, 19. The door openers 18, 19, may be constructed and arranged to open a door of a wafer cassette 4.

The wafer handler 13 may be constructed and arranged to transfer wafers between the wafer storage 40, the wafer boat 34 and/or the wafer cassettes 4. The wafer handler 13 may be provided with a moveable wafer support for supporting a wafer. The wafer handler 13 may be provided with a horizontal drive to move the wafer support in a horizontal plane. The wafer handler 13 may be provided with a Z-drive to move the wafer support up and down in a vertical Z-direction substantially perpendicular to the horizontal plane from a minimal reach height to a maximal reach height.

The distance between the minimal reach height and the maximal reach height may be substantially equal to the length of the wafer boat 34. The distance between the minimal height and the maximal height may be at least the height of the door opening of the door opener(s) plus the height of the opening of the wafer storage 40.

The wafer storage 40 may be provided in the wafer handler chamber 44 above a door opener 18, 19. In such case the top of the wafer storage 40 may be equal or lower than the maximal reach height of the wafer support so that all storage positions in the wafer storage 40 may be served by the wafer handler 13.

Alternatively, the wafer storage 40 may be provided below the door opener 18, 19. In such case the bottom of the wafer storage 40 may be equal or higher than the minimal reach height of the wafer support so that all storage positions in the wafer storage 40 may be served by the wafer handler 13.

Alternatively, the wafer storage 40 may also be provided between two door openers 18, 19. In such case the bottom of the door opening of the lower door opener may be equal or higher than the minimal reach height of the wafer support. The top of the door opening of the top door opener may be equal or lower than the maximal reach height of the wafer support. In this configuration both door openers 18, 19, and all storage positions in the wafer storage may be served by the wafer handler 13

The wafer storage may comprise 2 to 50, preferably 3 to 30 and most preferably 4 to 25 wafer holders 42 for holding wafers. The wafer holders 42 may comprise flat surfaces to support wafers.

The wafer holders 42 of the wafer storage 40 may comprise slots to support the wafers. The height of the box of the wafer storage 40 may be smaller, equal or higher than the height of a wafer cassette 4. The pitch of the slots in the wafer storage 40 may be smaller than the pitch of the slots in the wafer cassette 4 so that the wafer storage may store more wafers than a wafer cassette. The pitch of the wafer slots in a standardized wafer cassette 4 may be 10 mm for a cassette 4 for storing wafers with a 300 mm diameter. The pitch of the wafer slots of the wafer storage 40 may, for example, be between 3 to 9, preferably 4 to 8, most preferably 5 to 7 mm.

The pitch of 10 mm for the wafer slots in the standardized wafer cassette 4 is selected as to ensure that wafers within the standardized wafer cassette 4, which wafers are used for production, can be handled by any wafer handling tool in a semiconductor factory. For the filler and test wafers transferred to the wafer storage 40, this requirement may not be as strict because they may only be handled by one dedicated wafer handler 13 which may also transfer them to the standard cassettes 4. The smaller pitch of the wafer slots of the wafer storage 40 may make it possible to have more wafer slots within the wafer storage 40 as opposed to the standardized wafer cassette 4 to store more wafers or to occupy less space in the wafer handling chamber 44.

Filling the wafer storage 40 with filler and/or test wafers may be carried out as follows. A wafer cassette 4 with filler and/or test wafers may be introduced on the input/output station 21. The wafer cassette 4 with filler and/or test wafers may be transferred from the input/output station 21 with the aid of cassette handler 10 into the storage system 2 and/or to the turn tables 15, 16. Upon rotation of the turn tables 15, 16, the cassette with filler and/or test wafers may be placed against door openers 18, 19. After removing the door of the wafer cassette 4 with the door openers 18, 19, the filler and/or test wafers may be transferred by the wafer handler 13 to the wafer storage 40 directly. Also a part of the filler and/or test wafers may directly be loaded in the wafer boat 34, processed in the reaction chamber 6, 7, and then unloaded to the wafer storage 40. By transferring a large part of the filler and/or test wafers to the wafer storage 40 a full wafer cassette 4 with up to 25 filler and/or test wafers may be unloaded by the wafer handler 13. Since the up to 25 test and or filler wafers may fill a complete wafer cassette 4 in this way efficient use of the cassette opening and transfer capabilities may be made.

The processing of a large number of production wafers may be carried out as follows. A number of wafer cassettes 4 may be introduced on the input/output station 21. Each of the wafer cassettes 4 may be transferred from the input/output station 21 with the aid of cassette handler 10 into the storage system 2 and/or the turn tables 15, 16. Upon rotation of the turn tables 15, 16, the wafer cassettes may be placed against door openers 18, 19. After removing the door of the wafer cassette 4 with the door openers 18, 19 the production wafers may be transferred by the wafer handler 13 to the wafer boat 34.

During filling the wafer boat 34 with wafers the wafer handler may transfer filler and/or test wafers from the wafer storage 40 to the wafer boat 34. The filler and/or test wafers may, for example, be inserted in the top and bottom of the wafer boat 34. The test wafers may be equally spread over the wafer boat 34.

After the substrate boat 34 has been filled with production wafers and filler and/or test wafers the substrate boat 34 may be placed on boat carousel 32 with boat handling apparatus 12. The boat carousel 32 then may move the substrate boat 34 to a position below the process chamber 6, 7 to be loaded. Then the lift 33 may move the boat 34 into the process chamber 6, 7.

Processed substrates may execute a movement counter to the above. The filler and/or test wafers may be selected out from the production wafers and loaded in the wafer storage 40 by the wafer handler 13.

The filler wafers may be reused from the wafer storage 40. The filler wafers may be stored in the wafer storage 40 for cleaning later on. When a reasonable number of used filler wafers (for example 10 to 25) is present in the wafer storage 40 they may be transferred to a cassette for cleaning. Since 25 filler wafers may fill a complete cassette 4 in this way efficient use of the cassette opening and transfer capabilities may be made.

Test wafers may be used only one time. Since only a limited number of test wafers will be inserted in the wafer boat per process run storing a large number of test wafers temporarily in the wafer storage may save space and time. When a reasonable number of used test wafer (for example 10 to 25) is present in the wafer storage 40 they may be transferred to a cassette for further processing. Since 25 test wafers may fill a complete cassette 4 in this way efficient use of the cassette opening and transfer capabilities may be made.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and sub combinations of the various processes, systems, and configurations, and other features, functions, acts, and/or properties disclosed herein, as well as any and all equivalents thereof.

What is claimed is:

1. A method for processing production wafers comprising:
   providing an apparatus comprising:
   a process chamber constructed and arranged to process a plurality of wafers within a wafer boat;
   a cassette handler chamber to handle wafer cassettes with wafers; and,
   a wafer handler chamber provided with a wafer handler to transfer wafers from the wafer cassettes to the wafer boat, wherein the wafer handler chamber is provided with a wafer storage, and the wafer handler is constructed and arranged to transfer wafers between the wafer storage, the wafer boat, and/or wafer cassettes, wherein the wafer handler chamber is provided with a wall and the wafer storage is fixed in or to the wall, and wherein the wafer storage is provided as a box with box opening in the wall in the direction of the wafer handler;
   loading a plurality of filler and/or test wafers from a first wafer cassette to the wafer storage with the wafer handler, wherein the wafer storage comprises 2 to 50 wafer holders for holding wafers;
   after loading filler and/or test wafers to the wafer storage, loading production wafers contained in a second wafer cassette from the second wafer cassette directly to the wafer boat with the wafer handler;
   after loading the production wafers to the wafer boat, loading at least one filler and/or test wafers from the wafer storage to the wafer boat with the wafer handler;
   moving the wafer boat into the process chamber;
   processing the production, the filler and/or tests wafers in the wafer boat in the process chamber;
   moving the wafer boat out of the process chamber;
   unloading the filler and/or test wafers from the wafer boat to the wafer storage; and,
   after unloading the filler and/or test wafers, unloading the production wafers from the wafer boat to the second wafer cassette with the wafer handler.

2. The method according to claim 1, further comprising:
   after unloading the production wafers from the wafer boat to the first wafer cassette, loading a second set of production wafers from a third wafer cassette to the wafer boat with the wafer handler;
   loading filler and/or test wafers from the wafer storage to the wafer boat with the wafer handler;
   moving the wafer boat out of the process chamber;
   processing the second set of production wafers and the filler and/or test wafers in the wafer boat in the process chamber.

3. The method according to claim 1, wherein the step of loading filler and/or test wafers from the wafer storage comprises inserting the filler wafers in a top and a bottom of the wafer boat.

4. The method according to claim 1, further comprising unloading the filler and/or test wafers from the wafer boat to the wafer storage with the wafer handler.

5. The method according to claim 4, further comprising loading the filler and/or test wafers form the wafer storage to a third wafer cassette with the wafer handler and filler/and or test wafers, in the range of 10 to 25, that have been through the process chamber and are unloaded into the wafer storage.

6. The method according to claim 1, wherein in the step of loading production wafers, all production wafers contained in the second wafer cassette are loaded from the second wafer cassette directly to a wafer boat.

7. The method according to claim 1, wherein loading the plurality of filler and/or test wafers from the first wafer cassette to a wafer storage comprises loading the plurality of filler and/or test wafers from the first wafer cassette directly to the wafer storage.

8. The method according to claim 1, wherein a pitch of the wafer storage is less than a pitch of the wafer cassettes.

9. The method according to claim 8, wherein the pitch of the wafer storage is between 4 to 8 mm.

10. The method according to claim 8, wherein the pitch of the wafer storage is between 5 to 7 mm.

11. The method according to claim 1, wherein loading at least one filler and/or test wafers from the wafer storage to the wafer boat with the wafer handler comprises loading a plurality of filler and/or test wafer storage to the wafer boat with the wafer handler.

12. The method according to claim 1, wherein loading a plurality of fillers and/or test wafers from the wafer storage to the wafer boat with the wafer handler comprises loading at least one filler and/or test wafers into a top of the wafer boat and loading at least one filler and/or test wafers into a bottom of the wafer boat.

13. A method for processing production wafers comprising:
   providing an apparatus comprising:
      a process chamber constructed and arranged to process a plurality of wafers within a wafer boat;
      a cassette handler chamber to handle wafer cassettes with wafers, and
      a wafer handler chamber provided with a wafer handler to transfer wafers from the wafer cassettes to the wafer boat, wherein the wafer handler chamber is provided with a wafer storage, and the wafer handler is constructed and arranged to transfer wafers between the wafer storage, the wafer boat, and/or wafer cassettes, wherein the wafer handler chamber is provided with a wall and the wafer storage is fixed in or to the wall, and wherein the wafer storage is provided as a box with box opening in the wall in the direction of the wafer handler;
   loading a plurality of filler and/or test wafers to the wafer storage with the wafer handler;
   processing a batch of wafers, wherein processing a batch of wafers comprises:
      loading production wafers to the wafer boat with the wafer handler;
      after loading the production wafers to the wafer boat, loading at least one filler and/or test wafers from the wafer storage to the wafer boat with the wafer handler,
      moving the wafer boat into the process chamber,
      processing the production wafers and the at least one filler and/or test wafers in the wafer boat in the process chamber,
      moving the wafer boat out of the process chamber,
      unloading the at least one filler and/or test wafers from the wafer boat to the wafer storage, and,
      unloading the production wafers from the wafer boat with the wafer handler.

14. The method according to claim 13, further comprising:
   repeating the step of processing a batch of wafers a plurality of times, wherein the production wafers and the at least one filler and/or test wafers have not been processed in a previous step of processing a batch of wafers;
   after 10 to 25 test and/or filler wafers have been processed, removing the plurality of test and/or filler wafers form the wafer storage.

15. The method according to claim 13, wherein a pitch of the wafer storage is less than a pitch of the wafer cassettes.

16. The method according to claim 15, wherein the pitch of the wafer storage is between 4 to 8 mm.

* * * * *